United States Patent
Zhang et al.

(10) Patent No.: US 8,612,168 B2
(45) Date of Patent: *Dec. 17, 2013

(54) METHOD AND APPARATUS FOR ESTIMATING BATTERY CAPACITY OF A BATTERY

(75) Inventors: Yilu Zhang, Northville, MI (US); Kwang-Keun Shin, Rochester Hills, MI (US); Xidong Tang, Sterling Heights, MI (US); Mutasim A. Salman, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 477 days.

This patent is subject to a terminal disclaimer.

(21) Appl. No.: 12/887,655

(22) Filed: Sep. 22, 2010

(65) Prior Publication Data

US 2012/0072145 A1 Mar. 22, 2012

(51) Int. Cl.
*G01R 31/36* (2006.01)
*G06F 11/30* (2006.01)

(52) U.S. Cl.
USPC ............... 702/63; 702/64; 702/65; 702/182; 702/183

(58) Field of Classification Search
USPC .......... 702/63–65, 81–84, 121–123, 182–189
See application file for complete search history.

(56) References Cited

U.S. PATENT DOCUMENTS

| | | | |
|---|---|---|---|
| 5,321,627 A * | 6/1994 | Reher | 702/63 |
| 6,621,250 B1 * | 9/2003 | Ohkubo et al. | 320/136 |
| 2007/0013347 A1 * | 1/2007 | Kamohara | 320/160 |

* cited by examiner

*Primary Examiner* — Phuong Huynh

(57) ABSTRACT

A method is provided for determining a battery capacity for a vehicle battery. Open circuit voltages of a vehicle battery are measured during ignition startups. A battery parameter is estimated for the vehicle battery that is a function of a present open circuit voltage measurement for a present ignition startup, a function of at least one open circuit voltage observation of a previous ignition startup, a function of a current draw integration over a time period from a previous ignition startup event to a present ignition startup event, and a function of an adjustment factor. A battery parameter is determined based on a new battery. The battery capacity is calculated as function of the battery parameter for the vehicle battery and the battery parameter for the new battery.

14 Claims, 3 Drawing Sheets

METHOD AND APPARATUS FOR ESTIMATING BATTERY CAPACITY OF A BATTERY

BACKGROUND OF INVENTION

An embodiment relates generally to determining battery capacity within a vehicle.

Determining a battery capacity for a battery can be performed utilizing various techniques utilizing coulomb counting or parameter estimations techniques. Coulomb counting involves the use of one measurement (i.e., one open circuit voltage reading) to estimate the battery state-of-charge. The accuracy of the open circuit voltage is critical to determining a state of charge. If there is measurement error, then the state-of-charge estimation will be in error by basically the factor of the measurement error.

Moreover, coulomb counting techniques utilizing charge efficiency and battery capacity to determine state-of-charge often use the standard manufacturing specification values for a new battery values throughout the estimation process for the life of the battery. Over time the battery ages and charge efficiency and battery capacity changes as well thereby creating error in the state-of-charge estimation.

Current parameter estimation techniques require excitations which are not necessarily available on conventional vehicles.

SUMMARY OF INVENTION

An advantage of an embodiment is the determination of a battery capacity where error in estimating the battery capacity is reduced by utilizing the integration of both present and previous open circuit voltage measurements/estimations and current draws. Deficiencies of prior art techniques are overcome by not solely basing the determination of the battery capacity on a new battery. Since battery characteristics change over a life of the battery, utilizing both present and past battery characteristic measurements/estimations provide a more comprehensive analysis as to how the battery is changing over a course of time which reduces any anomalies that may occur in a single measurement/estimation.

An embodiment contemplates a method of determining a battery capacity for a vehicle battery. Open circuit voltages of a vehicle battery are measured during ignition startups. A battery parameter is estimated for the vehicle battery that is a function of a present open circuit voltage measurement for a present ignition startup, a function of at least one open circuit voltage observation of a previous ignition startup, a function of a current draw integration over a time period from a previous ignition startup event to a present ignition startup event, and a function of an adjustment factor. A battery parameter is determined based on a new battery. The battery capacity is calculated as function of the battery parameter for the vehicle battery and the battery parameter for the new battery.

An embodiment contemplates a system for determining a battery capacity for a vehicle battery. The system includes a battery, at least one component for drawing power from the battery, a voltmeter for measuring an open circuit voltage of the battery at ignition start sequences, and a current sensor for sensing current drawn from the battery. The system further includes a control module for determining a battery parameter for the vehicle battery that is a function of a present open circuit voltage measurement for a present ignition startup, a function of at least one open circuit voltage observation of a previous ignition startup, a function of a current draw integration over a time period from a previous ignition startup event to a present ignition startup event, and a function of an adjustment factor. The control module further determines a battery parameter based on a new battery. The control module calculates the battery capacity as function of the battery parameter for the vehicle battery and a function of the battery parameter for the new battery.

DETAILED DESCRIPTION

Figure 1:
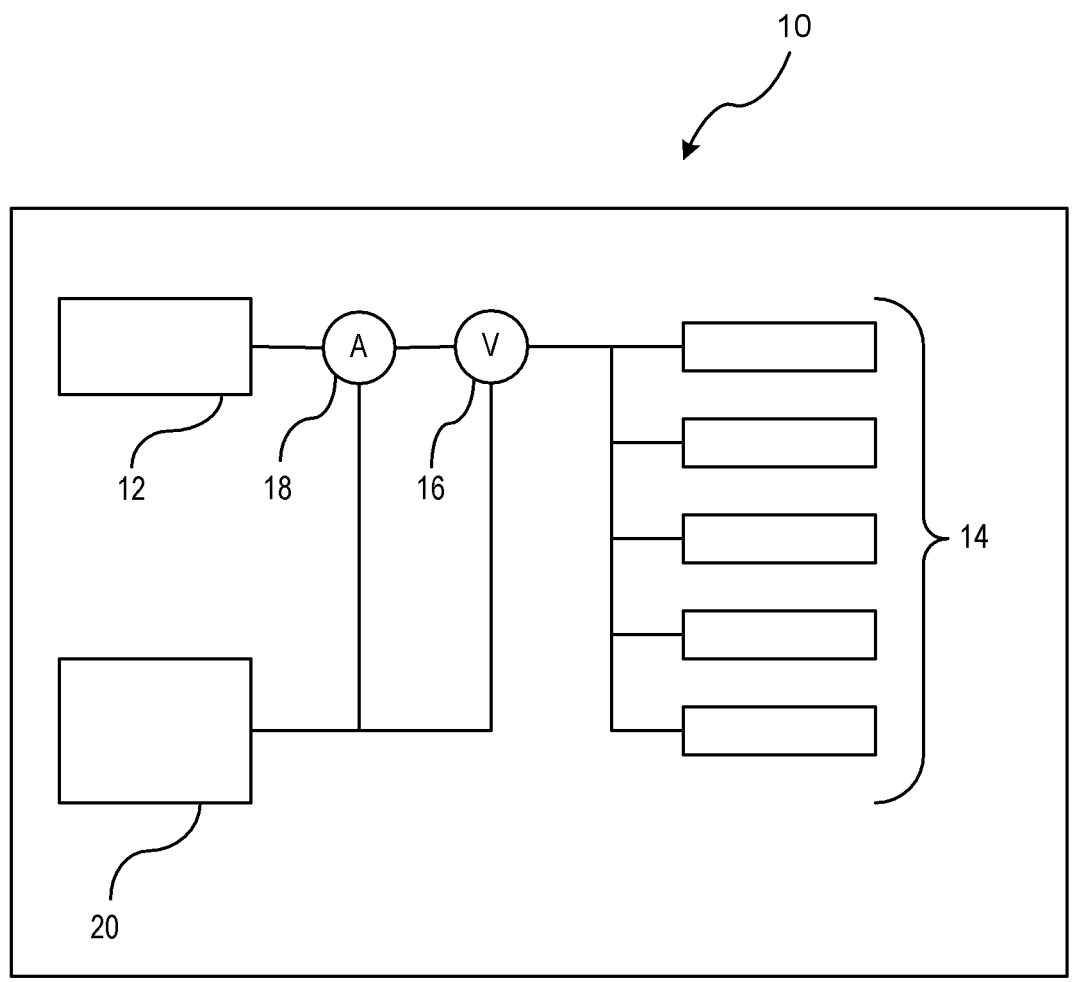
FIG. 1 is a block diagram system for estimating a state-of-charge (SOC) and battery capacity of a battery.

FIG. 1 illustrates a block diagram of an embodiment of a vehicle 10 incorporating a state-of-charge (SOC) and battery capacity estimation system. It should be understood that the vehicle may include, but is not limited to, hybrid vehicles, internal combustion vehicles, and electric vehicles or any machinery that utilizes batteries. The vehicle 10 includes a battery pack 12 having a single battery or a plurality of individual battery modules. For example, an embodiment may include a plurality of batteries connected in series to produce a high voltage nominal voltage or a vehicle may include a single 12 volt battery producing a 14 volt nominal voltage for an internal combustion vehicle. The state-of-charge and battery capacity estimation technique described herein may be applicable to variety of battery types, including but not limited to, nickel metal hydride (NiMH) batteries, lead acid batteries, or lithium ion batteries.

The vehicle battery 12 is electrically coupled to a plurality of devices 14 which utilize the battery as a power source. The vehicle 10 may further include a current sensor 16, and voltage meter 18, and a control module 20.

The plurality of devices 14 include, but are not limited to, power outlets adapted to an external plug in device, accessories, components, subsystems, and systems of a vehicle. The current sensor 16 is used to monitor the current leaving the vehicle battery 12. The voltmeter 18 measures a voltage so that an open circuit voltage may be determined. A control module 20, or similar module, obtains, derives, monitors, and/or processes a set of parameters associated with vehicle battery 12. These parameters may include, without limitation, current, voltage, state-of-charge (SOC), battery capacity, battery internal resistances, battery internal reactance, battery temperature, and power output of the vehicle battery. The control module 20 includes an algorithm, or like, for executing a vehicle state-of-charge and battery capacity estimation technique. In a hybrid vehicle or electric vehicle, it is typical that a current sensor is integral to the control module.

To enhance battery charging control and vehicle power management, the open circuit voltage $V_{oc}$ is used to estimate the SOC. The SOC of the battery is estimated utilizing a startup SOC and a run SOC change. The formula for the SOC of the battery is represented as follows:

$$S_{oc} = SOC_{startup} + SOC_{running} = f(V_{oc}(0), T) + \theta \int I dt \qquad (1)$$

where $f(V_{oc}(0), T)$ is the startup SOC that is a function of the open circuit voltage and temperature, and $\theta \int I dt$ is the run SOC change that is a function of a battery parameter $\theta$ and previous current data integration. The battery parameter $$\theta\left(=\frac{c}{Q}\right)$$

is a function of battery charge efficiency c and battery capacity Q.

The open circuit voltage $V_{oc}$ is a key element in determining the SOC. Therefore the following embodiment will focus on how $V_{oc}$ is derived and utilized in determining $SOC_{startup}$ and $SOC_{running}$.

Figure 2:
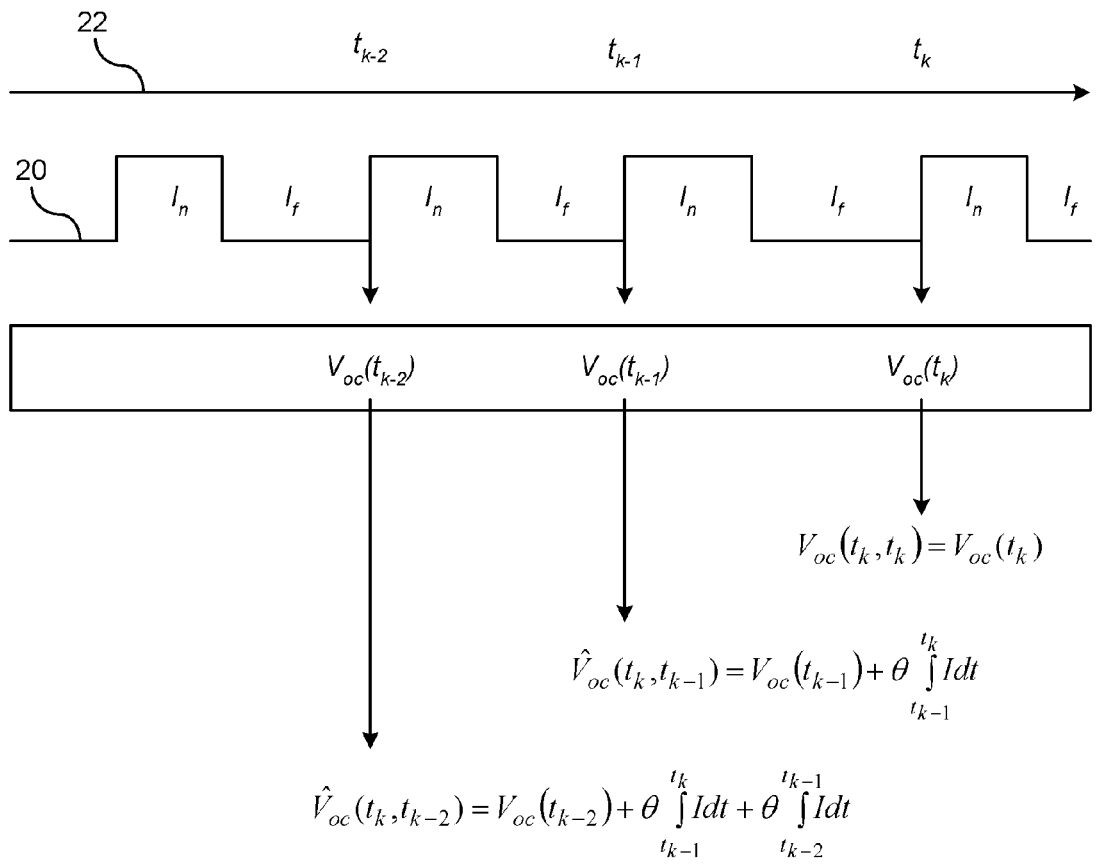
FIG. 2 is a timeline schematic illustrating time instances for determining open circuit voltages.

FIG. 2 illustrates a timeline for estimating a plurality of open circuit voltages for $SOC_{startup}$ which takes into consideration historical data. Historical data relates to previous instances of time at which an ignition off and ignition on event is detected and battery characteristics are observed. The term observed used herein refers to measured and/or estimated values based on measurements. A timing sequence of continuous ignition on $I_n$ and ignition off $I_f$ events is shown generally at 20. Timeline 22 illustrates each of the time instances when the ignition transitions from an ignition-off to an ignition-on (e.g., $t_{k-2}, t_{k-1}, t_k$). Based on the different time instances, an open circuit voltage may be determined for each time instance taking into consideration not only the present open circuit voltage measurement, but also previous open circuit voltage measurements for estimating a more precise open circuit voltage value at the $k_{th}$ ignition event. Formulas for the time instances $t_{k-2}, t_{k-1}, t_k$ shown in FIG. 2 are represented by the following formulas:

$$\hat{V}_{oc}(t_k, t_k) = V_{oc}(t_k) \tag{2}$$

$$\hat{V}_{oc}(t_k, t_{k-1}) = V_{oc}(t_{k-1}) + \theta \int_{t_{k-1}}^{t_k} I dt \tag{3}$$

$$\hat{V}_{oc}(t_k, t_{k-2}) = V_{oc}(t_{k-2}) + \theta \int_{t_{k-1}}^{t_k} I dt + \theta \int_{t_{k-2}}^{t_{k-1}} I dt \tag{4}$$

When taking into consideration the past observations, a weighted average is obtained utilizing an adjustment factor $\lambda$. The adjustment factor $\lambda$ weights the open circuit voltage estimation based on the duration of the key-off time or the key-on time. It should be understood that the technique described herein for determining the adjustment factor is only one embodiment of how the adjustment factor may be determined and that other techniques used to determine the adjustment factor may be applied herein without deviating from the scope of the invention. The formula for determining the open circuit voltage utilizing the adjustment factor is represented by the following formula:

$$\hat{V}_{oc}(t_k) = \lambda \left\{ \hat{V}(t_{k-1}) + \hat{\theta} \int_{t_{k-1}}^{t_k} i dt \right\} + (1-\lambda) V_{oc}(t_k). \tag{5}$$

where $$\left\{ \hat{V}(t_{k-1}) + \hat{\theta} \int_{t_{k-1}}^{t_k} i dt \right\}$$

represents the estimation based on previous observation $(t_{k-n})$, and $(1-\lambda)V_{oc}(t_k)$ represents a present observation $(t_k)$.

Therefore, if the key-off time is too short, then a greater emphasis is placed on the estimated value in which the adjustment factor would be preferably close to 1. If the key-off time is greater than a predetermined time value, then a greater emphasis is placed on the current observation, and the adjustment factor would be preferably close to 0. As a result, the following formula is used to determine the adjustment factor $\lambda$ which is a function of the time off. The adjustment factor $\lambda$ for the open circuit voltage is represented by the following formula:

$$\lambda = e^{-t_{off}(t_k)/\tau} \tag{6}$$

where $t_{off}$ is a time from when the ignition key is turned off to a time the ignition is turned on, $t_k$ is a time the ignition key is turned on at the $k_{th}$ ignition interval, and $\tau$ is a time constant.

The battery parameter $\theta$ is commonly determined by a ratio of the charge efficiency and the battery capacity. Charge efficiency and battery capacity values are typically nominal values based on a new battery. However, such parameters change as the battery ages, and as a result, are not robust factors for determining the battery parameter $\theta$. Since these parameters change with age, the battery parameter $\theta$ should be estimated periodically. To estimate the battery parameter $\theta$ on a periodic basis (e.g., once a month), the battery parameter $\theta$ is solved for utilizing the open circuit voltage formula which is represented as follows:

$$\hat{V}_{oc}(t_k) = \hat{V}_{oc}(t_{k-1}) + \hat{\theta}_k \int_{t_{k-1}}^{t_k} I dt. \tag{7}$$

By modifying the open circuit voltage $\hat{V}_{oc}(t_k)$ to solve for $\theta$, the resulting battery parameter $\theta$ is represented as follows:

$$\hat{\theta}_k = \frac{V_{oc}(t_k) - \hat{V}_{oc}(t_{k-1})}{\int_{t_{k-1}}^{t_k} I dt} \tag{8}$$

To compensate for short ignition key-off times, an adjustment factor is incorporated in the battery parameter estimation formula. The adjustment factor for the battery parameter $\lambda_\theta$ is represented by the following formula:

$$\lambda_\theta = e^{-t_{off}(t_k)/\tau_\theta} \tag{9}$$

The resulting formula for the battery parameter is as follows:

$$\hat{\theta}_k = \lambda_\theta \hat{\theta}_{k-1} + (1-\lambda_\theta) \frac{V_{oc}(t_k) - \hat{V}_{oc}(t_{k-1})}{\int_{t_{k-1}}^{t_k} I dt} \tag{10}$$

where $\hat{\theta}_{k-1}$ is the previous battery parameter estimation and $$\frac{V_{oc}(t_k) - \hat{V}_{oc}(t_{k-1})}{\int_{t_{k-1}}^{t_k} I dt}$$

a present battery parameter estimation.

Due to temperature differences when measurements for current and previous open circuit voltage are obtained, the estimation technique generated herein requires normalization between the open circuit voltage measurements. That is, each open circuit voltage (i.e., both present and previous), must be normalized at a standard temperature so that present observations and past observations can be cooperatively utilized. As a result, each open circuit voltage for a respective ignition event is converted to an open circuit voltage based on a normalized temperature. The conversion may be performed utilizing an algorithm, lookup table, or the like. For example, a normalized formula utilizing a standardized temperature, such as 25 degrees, is represented as follows:

$$\hat{V}_{oc}^{25}(t_k) = \lambda\left\{\hat{V}_{oc}^{25}(t_{k-1}) + \hat{\theta}_{k-1}^{25}\int_{t_{k-1}}^{t_k} Idt\right\} + (1-\lambda)V_{oc}^{25}(t_k). \quad (11)$$

The battery parameter using normalized temperatures is as follows:

$$\hat{\theta}_k^{25} = \lambda_\theta \hat{\theta}_{k-1}^{25} + (1-\lambda_\theta)\frac{V_{oc}^{25}(t_k) - \hat{V}_{oc}^{25}(t_{k-1})}{\int_{t_{k-1}}^{t_k} Idt}. \quad (12)$$

As a result, the open circuit voltage for the SOC of the vehicle battery can be represented by the following formula:

$$\hat{V}_{oc}^{25}(t, t_k) = \hat{V}_{oc}^{25}(t_k) + \theta_k^{25}\int_{t_k}^{t} Idt. \quad (13)$$

Once the normalized open circuit voltage $\hat{V}_{oc}^{25}(t,t_k)$ for the SOC of the battery is determined, the normalized open circuit voltage is converted back to the open circuit voltage at the current temperature and is represented by $\hat{V}_{oc}(t)$.

The SOC charge of the battery is determined utilizing $\hat{V}_{oc}(t)$ that incorporates estimations of both current measurements and previous measurements. The other factors in determining SOC can be basically grouped as a linear mapping constant. As a result, the SOC of the vehicle battery at the present instance of time may be represented by the following formula:

$$SOC(t)=f(\hat{V}_{oc}(t),T) \quad (14)$$

where $\hat{V}_{oc}(t)$ is the estimated open circuit voltage of the battery using current measurements and previous measurements, and T is a respective temperature at the time of the measurement.

The battery capacity Q is also determined utilizing current measurements and battery parameters. The battery capacity is derived utilizing the following formula represented by:

$$Q_{actual}^{25}=Q_{new}^{25}(\theta_{new}^{25}/\theta_k^{25}) \quad (15)$$

where $Q_{actual}^{25}$ is the normalized estimated battery capacity of the battery, $Q_{new}^{25}$ is a normalized battery capacity of a new battery, $\theta_{new}^{25}$ is a normalized battery parameter of a new battery, and $\hat{\theta}_k^{25}$ is the normalized estimated battery parameter as a function of an adjustment factor. It should be understood that in deriving the battery capacity, estimations must be derived using a standard temperature (e.g., 25 degrees). The formula for determining the battery parameter at the $k_{th}$ ignition start is represented by the following formula:

$$\hat{\theta}_k^{25} = \lambda_\theta \hat{\theta}_{k-1}^{25} + (1-\lambda_\theta)\frac{V_{oc}^{25}(t_k) - \hat{V}_{oc}^{25}(t_{k-1})}{\int_{t_{k-1}}^{t_k} Idt} \quad (16)$$

The battery capacity as shown in equation (15) may be simplified to the following formula:

$$Q_{actual}^{25}=c_{new}/\theta_k^{25} \quad (17)$$

where $c_{new}$ is the charge efficiency for a new battery. Simplifying the battery capacity to the form shown in equation (17) is as follows. The battery parameter for a new battery is represented as follows:

$$\theta_{new}=c_{new}/Q_{new}. \quad (18)$$

The formula for battery parameter estimation shown in equation 18 is a valid estimation when the charge efficiency and battery capacity of the battery is actually known. As a battery ages, the charge efficiency and battery capacity of an aging battery changes. Therefore, a battery parameter estimation for a new battery can be determined using equation (18). Such values (e.g., $c_{new}$ and $Q_{new}$) for determining the characteristics of the new battery may be obtained by the battery manufacturer or performing a bench test (i.e., fully discharging a battery and fully charging a battery). A new battery is a battery that is newly manufactured and has had very limited cycling occur (e.g., charging/discharging). Referring again to equation (15), the formula of the battery parameter $\theta_{new}$ determined in equation (18) is substituted in equation (15) resulting in the following formula:

$$Q_{actual} = Q_{new}\left(\frac{\left(\frac{c_{new}}{Q_{new}}\right)}{\theta_k^{25}}\right), \quad (19)$$

As a result, equation (19) may be simplified to the formula shown in equation (17) where $Q_{actual}=c_{new}/\theta_k$.

Figure 3:
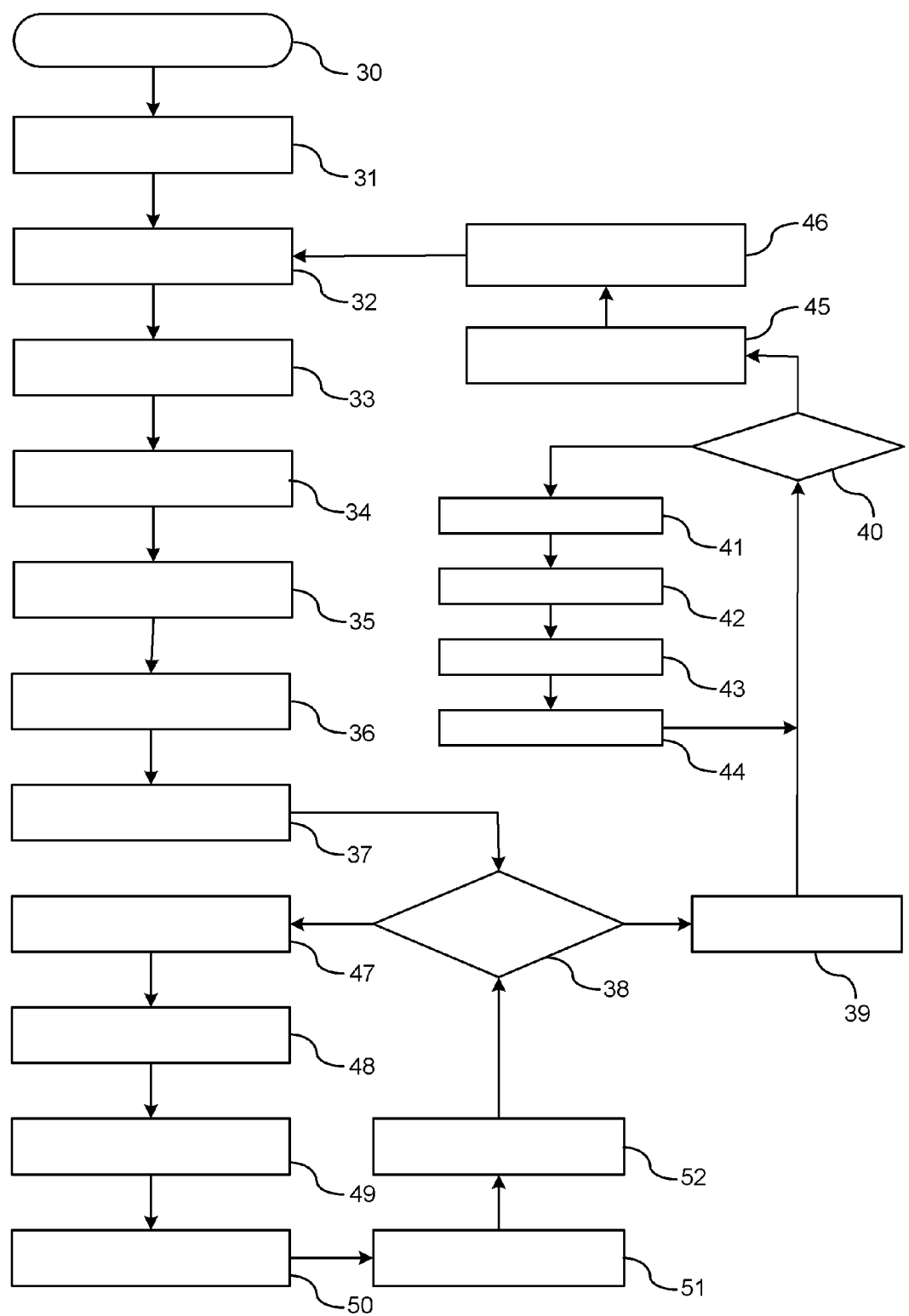
FIG. 3 a flowchart of a method for determining a state of charge (SOC) of a battery and battery capacity.

FIG. 3 illustrates a flowchart for a technique for estimating the SOC and battery capacity utilizing $V_{oc}$ data. In step 30, a first key-on event is initiated. The first key-on represents a time when the vehicle ignition is first started and data is collected. The first key-on event may also represent a time when the vehicle ignition is started directly after the vehicle battery is replaced and data is obtained for the new battery. In this manner, previous data relating to past battery operating conditions and parameters would no longer be valid since the new battery would have different charging and efficiency characteristics (e.g., charge efficiency values and battery capacity values).

In step 31, the measurable parameters and estimated parameters are initialized. That is, at the initiation of a new vehicle startup or when the battery is replaced, all variables for the each of the formulas described above are re-set to their initial conditions. For example, k=0, λ=0, $\lambda_\theta=1$, $\theta_0^{25}=\theta_{new}^{25}$, $\hat{V}_{oc}^{25}(0)=13V$, $\Delta Q=Q_{new}^{25}$.

In step 32, the present open circuit voltage $V_{oc}(t_k)$ and the battery temperature T are measured.

In step 33, the open circuit voltage $V_{oc}(t_k)$ is converted to an open circuit voltage at a standard temperature $V_{oc}^{25}(t_k)$. The conversion may be performed using an algorithm or a lookup table.

In step 34, the startup voltage is updated using the formula set forth in equation (11).

In step 35, the battery parameter is updated using the formula set forth in equation (12).

In step 36, the battery capacity is updated using the formula set forth in equation (15).

In step 37, the current integration ∫Idt is reset to zero.

In step 38, a determination is made whether the ignition key is in the key-off position. If the ignition is in the key-off position, then the routine proceeds to step 39; otherwise the routine proceeds to step 47.

In step 39, the key-off time is reset to zero ($t_{off}=0$). This initiates a counter for determining how long the ignition is in the key-off position.

In step 40, a determination is made whether the ignition key is in the key-on position. If the ignition key is not in the key-on position, then the routine proceeds to step 41.

In step 41, the routine waits for a period of time before updating the key-off time.

In step 42, the key-off time is updated. The key-off time is represented by the following formula:

$$t_{off}=t_{off}+\Delta t_{off}$$

where $t_{off}$ is a summation of the key-off time since the resetting the key-off time, and $\Delta t_{off}$ is the additive time period elapsed in step 41.

In step 43, the current measurement (I) of the battery is measured.

In step 44, the current integration is updated which incorporates the present current measurement with the past current measurements. The routine proceeds back to step 40.

In step 40, if the determination is made that the ignition key is on, then the routine proceeds to step 45, otherwise, the routine proceeds to step 41.

In step 45, a key-on cycle count is updated. The key-on cycle count is the number of times the ignition key has been turned on since system initialization in step 31. Each time the ignition key is turned on, the count is increased by 1.

In step 46, the adjustment factor is determined for the open circuit voltage as set forth in equation (6) and the adjustment factor is determined for the battery parameter as set forth in equation (8). Thereafter, a return is made to step 32 to execute steps 32-38 as described above.

In step 38, if the determination is made that the ignition key is not in the key-off position, then the routine proceeds to step 47.

In step 47, the current (I) leaving the battery and the temperature (T) is measured.

In step 48, the current integration is updated based on the past to present measurements.

In step 49, the running open circuit voltage $\hat{V}_{oc}^{25}(t)$ at the standard temperature is updated using the formula set forth in equation (13).

In step 50, the running open circuit voltage $\hat{V}_{oc}^{25}(t)$ is converted back to a running open circuit voltage $\hat{V}_{oc}(t)$ at the present temperature using an algorithm or a lookup table.

In step 51, the SOC for the battery at the present temperature is determined using the formula set forth in equation (14).

In step 52, a predetermined period of time elapses before returning to step 38.

The battery capacity derived in step 36 and the SOC derived step 51 are either displayed to the driver of the vehicle identifying the condition of the battery or may be represented in some other capacity for indicating the SOC and battery capacity.

While certain embodiments of the present invention have been described in detail, those familiar with the art to which this invention relates will recognize various alternative designs and embodiments for practicing the invention as defined by the following claims.

What is claimed is:

1. A method of determining a battery capacity for a vehicle battery, the method comprising the steps of:
    measuring open circuit voltages of a vehicle battery during ignition startups using a voltmeter;
    estimating, using a control module a battery parameter for the vehicle battery that is a function of a present open circuit voltage measurement for a present ignition startup, a function of at least one open circuit voltage observation of a previous ignition startup, a function of a current draw integration over a time period from a previous ignition startup event to a present ignition startup event, and a function of an adjustment factor;
    determining a battery parameter for a new battery using the control module; and
    calculating the battery capacity using the control module as function of the battery parameter for the vehicle battery and the battery parameter for the new battery.

2. The method of claim 1 wherein the battery parameter of the vehicle battery is a function of a previous battery parameter observation and a present estimated battery parameter.

3. The method of claim 2 wherein estimating a battery parameter for the vehicle battery is represented by the following formula:

$$\hat{\theta}_k = \lambda_\theta \hat{\theta}_{k-1} + (1-\lambda_\theta)\frac{V_{oc}(t_k)-\hat{V}_{oc}(t_{k-1})}{\int_{t_{k-1}}^{t_k} Idt}$$

where $\hat{\theta}_{k-1}$ is a previous battery parameter observation, $$\frac{V_{oc}(t_k)-\hat{V}_{oc}(t_{k-1})}{\int_{t_{k-1}}^{t_k} Idt}$$

a current battery parameter observation, where $V_{oc}(t)$ is the present open circuit voltage measurement at the $k_{th}$ ignition start, $\hat{V}_{oc}(t_{k-1})$ is a previous open circuit voltage observation, $\hat{\theta}_{k-1}$ is the battery parameter of the vehicle battery estimated at a previous ignition start, I is a current draw from the vehicle battery, and $\lambda_\theta$ is an adjustment factor.

4. The method of claim 3 wherein the adjustment factor for the battery parameter is a function of a time that an ignition key is off and is represented by the following formula:

$$\lambda_\theta = e^{-t_{off}(t_k)/\tau_\theta}.$$

5. The method of claim 3 wherein the battery capacity of the battery is determined from the following formula:

$$Q_{actual}=Q_{new}(\theta_{new}/\hat{\theta}_k)$$

where $Q_{actual}$ is the estimated actual estimated battery capacity of the vehicle battery, $Q_{new}$ is a battery capacity based on a new battery, $\theta_{new}$ is a battery parameter based on a new battery, and $\hat{\theta}_k$ is the estimated battery parameter of the vehicle battery.

6. The method of claim 5 wherein the battery parameter for the vehicle battery, the battery parameter for the new battery, and the charge capacity for the new battery are normalized at a respective temperature.

7. The method of claim 3 wherein the present open circuit voltage measurement, the previous open circuit voltage observation, and the battery parameter are normalized at a respective temperature.

8. The method of claim 1 wherein the battery capacity of the vehicle battery is displayed to user of the vehicle via a display device.

9. The method of claim 1 wherein a representation of the battery capacity of the battery is displayed to user of the vehicle via a display device.

10. A system for determining a battery capacity for a vehicle battery comprising:
   a battery;
   at least one component for drawing power from the battery;
   a voltmeter for measuring an open circuit voltage of the battery at ignition start sequences;
   a current sensor for sensing current drawn from the battery; and
   a control module for determining a battery parameter for the vehicle battery that is a function of a present open circuit voltage measurement for a present ignition startup, a function of at least one open circuit voltage observation of a previous ignition startup, a function of a current draw integration over a time period from a previous ignition startup event to a present ignition startup event, and a function of an adjustment factor, the control module further determining a battery parameter for a new battery, the control module calculating the battery capacity as function of the battery parameter for the vehicle battery and a function of the battery parameter for the new battery.

11. The system of claim 10 wherein the control module estimating a battery parameter for the vehicle battery is represented by the following formula:

$$\hat{\theta}_k = \lambda_\theta \hat{\theta}_{k-1} + (1-\lambda_\theta) \frac{V_{oc}(t_k) - \hat{V}_{oc}(t_{k-1})}{\int_{t_{k-1}}^{t_k} I dt}$$

where $\lambda_\theta \hat{\theta}_{k-1}$ is the previous battery parameter observation and $$\frac{V_{oc}(t_k) - \hat{V}_{oc}(t_{k-1})}{\int_{t_{k-1}}^{t_k} I dt}$$

a current battery parameter observation, where $V_{oc}(t)$ is the present open circuit voltage measurement at a $k_{th}$ ignition start, $\hat{V}_{oc}(t_{k-1})$ is a previous open circuit voltage observation, $\hat{\theta}_{k-1}$ is the battery parameter of the vehicle battery estimated at a previous ignition start, I is a current draw from the vehicle battery, and $\lambda_\theta$ is an adjustment factor.

12. The system of claim 11 wherein the control module determines the adjustment factor for the battery parameter of the vehicle battery as a function of a time that an ignition key is off, wherein the adjustment factor is determined by the following formula:

$$\lambda_\theta = e^{-t_{off}(t_k)/\tau_\theta}.$$

13. The system of claim 12 wherein the control module normalizes the present open circuit voltage measurement at the $k_{th}$ ignition start, the previous open circuit voltage observation, and the battery parameter of the vehicle battery are normalized at a respective temperature.

14. The system of claim 11 wherein the battery capacity of the battery is determined from the following formula:

$$Q_{actual} = Q_{new}(\theta_{new}/\hat{\theta}_k)$$

where $Q_{actual}$ is the estimated battery capacity of the vehicle battery, $Q^T_{current}$ is a normalized battery capacity based on a new battery, $\theta_{new}$ is a battery parameter based on a new battery, and $\hat{\theta}_k$ is the estimated battery parameter of the vehicle battery.

* * * * *